(12) United States Patent
Sumikawa et al.

(10) Patent No.: US 9,891,267 B2
(45) Date of Patent: Feb. 13, 2018

(54) KERNEL BASED CLUSTER FAULT ANALYSIS

(71) Applicant: FREESCALE SEMICONDUCTOR, INC., Austin, TX (US)

(72) Inventors: Nikolas Bradley Sumikawa, Chandler, AZ (US); Chen He, Cedar Park, TX (US)

(73) Assignee: NXP USA, Inc., Austin, TX (US)

(*) Notice: Subject to any disclaimer, the term of this patent is extended or adjusted under 35 U.S.C. 154(b) by 67 days.

(21) Appl. No.: 15/181,649

(22) Filed: Jun. 14, 2016

(65) Prior Publication Data
US 2017/0356955 A1 Dec. 14, 2017

(51) Int. Cl.
| | | |
|---|---|---|
| *G01R 31/28* | (2006.01) | |
| *G01R 31/3177* | (2006.01) | |
| *G01R 31/3185* | (2006.01) | |
| *G01R 31/26* | (2014.01) | |
| *G01R 31/01* | (2006.01) | |
| *G01R 31/18* | (2006.01) | |
| *H01L 21/66* | (2006.01) | |

(52) U.S. Cl.
CPC ......... *G01R 31/2831* (2013.01); *G01R 31/01* (2013.01); *G01R 31/18* (2013.01); *G01R 31/26* (2013.01); *G01R 31/3177* (2013.01); *G01R 31/318511* (2013.01); *H01L 22/00* (2013.01)

(58) Field of Classification Search
CPC ........ G01R 31/01; G01R 31/18; G01R 31/26; G01R 31/2831; G01R 31/318511; H01L 22/00
See application file for complete search history.

(56) References Cited

U.S. PATENT DOCUMENTS

| | | | |
|---|---|---|---|
| 6,885,950 B2 | 4/2005 | Mitsutake et al. | |
| 7,043,384 B2* | 5/2006 | Matsushita | G01R 31/01 324/500 |
| 7,222,026 B2 | 5/2007 | Matsushita et al. | |
| 7,813,539 B2* | 10/2010 | Shibuya | G06T 7/0004 382/141 |

(Continued)

OTHER PUBLICATIONS

Miller et al., "Unit level predicted yield: a method of identifying high defect density die at wafer sort." Test Conference, 2001. Proceedings. International. IEEE, 2001.

(Continued)

*Primary Examiner* — Shelly A Chase (57) ABSTRACT

A fault analysis method comprises: receiving fault data from wafer level testing that identifies locations and test results of a plurality of die; applying a kernel transform to the fault data to produce cluster data, where the kernel transform defines a fault impact distribution that defines fault contribution from the failed die to local die within an outer radial boundary of the fault impact distribution. Applying the kernel transform comprises: centering the fault impact distribution at a location of each die that failed wafer level testing, associating each local die that falls within the outer radial boundary with a respective fault contribution value according to the fault impact distribution, and accruing fault contribution values associated with each respective die of the plurality of die to produce a cluster value for the respective die, which correlates to a probability of failure of the respective die at a future time.

20 Claims, 8 Drawing Sheets

(56) References Cited

U.S. PATENT DOCUMENTS

2015/0377951 A1* 12/2015 Chang .................. G01R 31/26
324/762.05

OTHER PUBLICATIONS

Riordan et al., "Reliability improvement and burn in optimization through the use of die level predictive modeling." Reliability Physics Symposium, 2005. Proceedings. 43rd Annual. 2005 IEEE International. IEEE, 2005.

Daasch et al., "Neighbor selection for variance reduction in I DDQ and other parametric data." Test Conference, 2001. Proceedings. International. IEEE, 2001.

Singh et al., "Screening for Known Good Die Based on Defect Clustering: An Experimental Study," Proc. Int'l Test Conf. (ITC 97), IEEE CS Press, 1997, pp. 362-366.

Lakin et al., "Exploiting Defect Clustering to Screen Bare Die for Infant Mortality Failures: An Experimental Study," Proc. Int'l Test Conf. (ITC 99), IEEE CS Press, 1999, pp. 23-30.

Sumikawa et al., "An Experiment of Burn-In Time Reduction Based on Parametric Test Analysis," 2012 IEEE International Test Conference, pp. 1-10.

Moreno-Lizaranzu et al., "Improving Electronic Sensor Reliability by Robust Outlier Screening," Sensors (Basel, Switzerland), vol. 13, No. 10, pp. 13 521-13 542, 2013.

Illyes et al., "Statistical bin limits: an approach to wafer dispositioning in is fabrication," Advanced Semiconductor Manufacturing Conference and Workshop, 1990. ASMC 90 Proceedings. IEEE/SEMI 1990 pp. 95-98.

White et al., "Classification of Defect Clusters on Semiconductor Wafers Via the Hough Transformation," IEEE Transactions on Semiconductor Manufacturing, vol. 21, No. 2, May 2008, pp. 272-278.

Jeong et al., "Automatic Identification of Defect Patterns in Semiconductor Wafer Maps Using Spatial Correlogram and Dynamic Time Warping," IEEE Transactions on Semiconductor Manufacturing, vol. 21, No. 4, Nov. 2008, pp. 625-637.

Sumikawa et al., "A Pattern Mining Framework for Inter-Wafer Abnormality Analysis," International Test Conference 2013, 10 pages.

Rosenblatt et al., "Remarks on some nonparametric estimates of a denisty function," The Annals of Mathematical Statistics, vol. 27, No. 3, 1956, pp. 832-837.

Ester et al., "A Density-Based Algorithm for Discovering Clusters in Large Spatial Databases with Noise," Published in Proceedings of 2nd International Conference on Knowledge Discovery and Data Mining (KDD-96), vol. 96, No. 34, 1996, pp. 226-231.

* cited by examiner

KERNEL BASED CLUSTER FAULT ANALYSIS

BACKGROUND

Field

This disclosure relates generally to fault analysis of data from wafer level testing, and more specifically, to kernel based cluster fault analysis for detecting clustered latent defects caused by systemic process abnormalities.

Related Art

Semiconductor die are tested for failures at various stages through device production, such as at wafer level testing after the semiconductor wafer is fabricated, and again at burn-in stress testing after the semiconductor die are assembled into packages. Any failed die detected during such testing are discarded. If the failed die is assembled into a package, the entire package is discarded. It is beneficial to identify failed die as early as possible in the device production flow in order to reduce device production costs. However, while burn-in stress testing attempts to identify parts that are likely-to-fail in their life cycle, burn-in stress testing can cause overstressing of parts and may result in degrading the packages and overall product quality. Burn-in stress testing can also be an expensive step in a device test flow due to expensive equipment and long stress duration. For these cost and quality concerns, it is desirable to minimize the use of burn-in stress testing in a device test flow.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted.

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting. It is noted that the figures discussed herein are simplified for ease of illustration and explanation, and are not necessarily to scale.

Overview

During wafer fabrication, a fabrication defect or process abnormality may cause failures on several die of a wafer that are near one another, where the failures are clustered together. Some presently known methods use this clustering to identify die that are likely to fail in the future. However, only those die that "touch" or are immediately adjacent to the clustered failed die can be identified. In other words, these methods cannot identify die that are likely to fail in the future that are not immediately adjacent to the clustered failed die.

The present disclosure provides a fault analysis methodology that implements a kernel transform defining a fault impact distribution that indicates how the impact of the fault due to a fabrication defect or process abnormality is contributed from a failed die to neighboring dies in the vicinity of the failed die without requiring the neighboring dies to be immediately adjacent to the failed die. The kernel transform is applied to binary fault data from wafer level testing to produce cluster data that is used to identify predicted likely-to-fail die that passed wafer level testing but still have a high probability of failing burn-in stress testing or failing in a customer environment if the burn-in stress testing is skipped. Stated another way, the cluster data for a respective die correlates to a probability of failure of the respective die in the future, whether during burn-in stress testing or in the customer environment.

Example Embodiments

Figure 1:
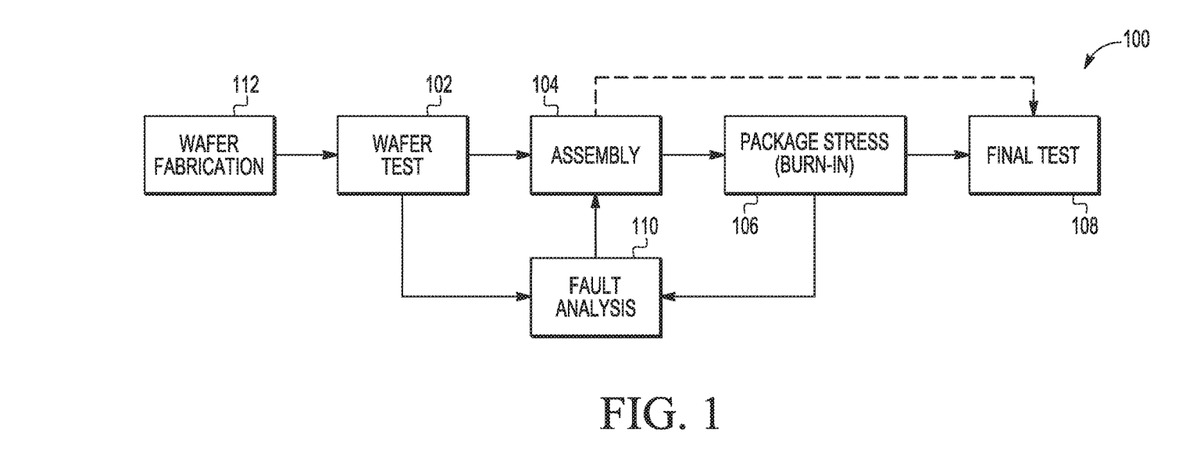
FIG. 1 illustrates a block diagram depicting an example process flow in which the disclosure is implemented, according to some embodiments.

FIG. 1 illustrates a block diagram depicting an example semiconductor device process flow 100 in which the disclosure is implemented. The process flow 100 begins at wafer fabrication 112, where a plurality of semiconductor wafers are fabricated, each semiconductor wafer including a plurality of semiconductor die. The semiconductor wafer described herein can be any semiconductor material or combinations of materials, such as gallium arsenide, silicon germanium, silicon-on-insulator (SOI), silicon, monocrystalline silicon, the like, and combinations of the above. The circuitry for the plurality of die on a wafer is formed using a sequence of numerous process steps applied to the wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like.

Due to the miniscule nature of wafer fabrication and the industry-wide push to scale down die size even further, die circuitry has a great sensitivity to any misalignment or variation of any of these numerous process steps during wafer fabrication 112, which may result in wide-spread fabrication defects in die across a given wafer, and more likely across a number of wafers produced by the faulty process steps. These fabrication defects may result in faults or errors on the die, such as contact misalignment, that will cause the die to be defective. In order to identify defective die (which may be defective due to either fabrication defects caused during wafer fabrication 112 or other causes), the process flow 100 continues to wafer level testing 102, where the die on each wafer is tested for functional defects. During wafer level testing 102, a number of die are tested in parallel (e.g., simultaneously), where specialized test patterns are applied to various signals pads of the die-under-test to test the die and results are read by testing equipment. Results of the test, also referred to as fault data, identify both die that fail wafer level testing 102 (also referred to as failed die) and die that pass wafer level testing 102 (also referred to as passed die). The fault data may be in the form of a binary wafer map that indicates pass/fail status for each die, and also indicates a location of each die on the wafer. The failed die may also be physically identified, such as by application of ink to the failed die.

The process flow 100 continues to assembly 104, where each wafer is singulated and the die that passed wafer level testing 102 are assembled into individual packaged semiconductor devices (also referred to as a package), which includes but is not limited to attachment of the die to a package substrate, electrical connections formed between the die and the package substrate, a number of peripheral components attached and electrically connected to the package substrate, to the die, or to both, and protection of the die and any components on the package substrate, such as by forming an encapsulant around the die and any components. The failed die may be discarded or further studied (e.g., cross-sectioning the failed die) to identify any failures caused by systemic fabrication defects or abnormalities that may have been caused the failure during wafer level testing 102.

Since each die that passes wafer level testing 102 may still suffer from fabrication detects that are latent or have not yet been revealed, the process flow 100 continues to package stress testing 106, also referred to as burn-in stress testing 106, where each package is stressed to force failures that can be identified during testing 106. A package is stressed during burn-in stress testing 106, such as being placed in an oven at an elevated temperature, and a specialized test pattern is applied to various signal pads of the package-under-test to test the package (e.g., test the die and any components of the package) and results are read by testing equipment. If a defective die or component is found in a package, the entire package is discarded.

The process flow 100 continues to final testing 108, where any remaining packages are tested again for failures, including but not limited to electrical testing, structural testing, or any additional testing needed to verify functionality of the package. If any defective die or component is found in a package, the entire package is discarded.

It is desirable to reduce fabrication costs by eliminating defective die much earlier in the design flow, without needing to discard the entire assembled package. One approach for identifying defective die earlier in the process flow is to perform fault analysis of the fault data produced during wafer level testing 102 to identify die that may have passed wafer level testing 102 but still have a high probability of failure during burn-in stress testing 106. In other words, the goal of fault analysis is to use locations of known failed die (which are identified during wafer level testing 102) to predict locations of latent likely-to-fail die (some of which are identified during burn-in stress testing 106).

Some methods for predicting locations of latent likely-to-fail die use fault clustering, based on the concept that at least some fabrication defects leading to defective die are not randomly distributed on a wafer, but instead tend to cluster together. The locations of known failed die are used to identify clusters of failed die, where any passed die that "touches" a failed die of the cluster is identified as bad die or predicted likely-to-fail die. It is noted that die that touch one another are immediately adjacent to one another without an intervening die (e.g., are side by side or corner to corner as viewed in a wafer layout). For example, a "Good Die in a Bad Cluster" (GDBC) method identifies a passed die that is surrounded or mostly surrounded by immediately adjacent failed die of a cluster as a bad die. Similarly, a "Bad Bin Bad Cluster" (BBBC) method identifies any passed die immediately adjacent to failed die of the cluster as bad die. A "nearest neighbor residual" (NNR) method compares an average test result of a die's immediately adjacent neighbors to identify die with large residuals or differences as bad die. A "unit level predicted yield" (ULPY) fault clustering method uses a weighted average of 24 surrounding die in the closest two rows and columns to identify a bad die. However, such methods do not predict bad die that do not touch a failed die in a cluster.

The present disclosure provides for fault analysis 110 that applies a kernel transform to the fault data (which identifies known failed die) from wafer level testing 102 to produce cluster data that identifies predicted likely-to-fail die, or die that passed wafer level testing 102 and have a high probability of failing during burn-in stress testing 106. Fault analysis 110 is based on the concept that each failed die contributes a certain amount of fault to neighboring die in the vicinity of the failed die, where some of the neighboring die are not immediately adjacent to the failed die. The fault contributed from a failed die to a neighboring die follows a normalized Gaussian distribution according to the distance between the neighboring die and the failed die. The fault contributed to a neighboring die impacts the probability of that neighboring die failing during burn-in stress testing 106, where the probability is represented by a fault contribution value.

The kernel transform defines a fault impact distribution for a failed die that represents the failed die's contributed fault to any neighboring die. Each neighboring die receives a fault contribution value that represents the fault contributed from the failed die to that neighboring die, which is determined from the fault impact distribution, as a function of distance from the failed die. A single die may be in the vicinity of multiple failed die without being immediately adjacent to a failed die, where the single die receives a respective fault contribution value from each of those multiple failed die. The fault contribution values associated with a single die are accumulated or summed together to produce a cluster value associated with the single die. In other words, the cluster value equals the summation of the fault contributed from each neighboring failed die. A cluster value is accumulated for each respective die on the wafer, where the cluster values form cluster data. Each cluster value has a magnitude of zero or greater, depending on the number of failed die in a die's vicinity.

If the cluster value is less than the threshold cluster value, a clustering failure is not identified, indicating that a random non-clustering failure occurred. If the cluster value is equal to or greater than a threshold cluster value, a clustering failure is identified, indicating that a systemic fabrication defect or abnormality likely occurred during wafer fabrication 112. Since each cluster value is cumulative of the fault contribution values from neighboring failed die, only one cluster value of the plurality of die need be equal to or greater than the threshold cluster value in order to identify a clustering failure. Once a clustering failure is identified, each passed die having a cluster value equal to or greater than the threshold cluster value is identified as a predicted likely-to-fail die. It is noted that for cluster values greater than or equal to the threshold cluster value, the cluster value magnitude depends on the density of the clustering failure (e.g., how closely failed die are located to one another), as well as to the size of the clustering failure (e.g., the number of failed die included in the cluster).

The cluster data that identifies predicted likely-to-fail die (or high risk die) is used to minimize the use of burn-in stress testing 106 in the process flow, since burn-in stress testing is expensive (in both cost and time) and may actually degrade the quality of the packages due to overstressing. In some cases, cluster data is provided to assembly 104 process, where assembly 104 may simply discard the predicted likely-to-fail die before assembling them into packages, saving assembly cost and time. In this case, burn-in stress testing 106 may be skipped entirely since the predicted likely-to-fail die are discarded. In other cases, the predicted likely-to-fail die may still be assembled into packages, which are then are targeted for burn-in stress testing 106, while the remaining packages skip burn-in stress testing 106 to minimize burn-in stress testing cost and quality concerns. The cluster data may also be provided back to wafer level testing 102, in order to identify the systemic fabrication faults and prevent them from occurring in future wafer batches. Stated another way, the cluster data for each respective die correlates to a probability of failure of the respective die at a future time (e.g., at some point after wafer level testing), whether during burn-in stress testing 106 or in the customer environment (if burn-in stress testing 106 is skipped).

It is also noted that during the early stages of implementation of fault analysis 110, fault analysis 110 may also receive fault data produced during burn-in stress testing 106 to be used as verification data for the cluster data produced from fault analysis 110. For example, fault analysis 110 may compare the locations of failed die identified during burn-in stress testing 106 with the locations of predicted likely-to-fail die from fault analysis 110 and verify whether any locations of the burn-in stress failed die match the locations of predicted likely-to-fail die. A high match rate indicates the cluster data is accurately predicting burn-in stress failed die. A low match rate indicates the fault impact distribution may need to be adjusted, such as by varying a bandwidth a, as further discussed below. During intermediate stages of implementation of fault analysis 110 when the cluster data produced by fault analysis 110 is accurately predicting likely-to-fail die, burn-in stress testing 106 may be performed intermittently or on a smaller subset of the packages output by assembly 104 for quality control to verify accuracy and consistency of the cluster data. During latter stages of implementation of fault analysis 110 when the cluster data produced by fault analysis 110 is verified to accurately and consistently predict likely-to-fail die, burn-in stress testing 106 may be omitted altogether, where the process flow 100 optionally continues from assembly 104 directly to final test 108 (as indicated by the dashed line).

Figure 2:
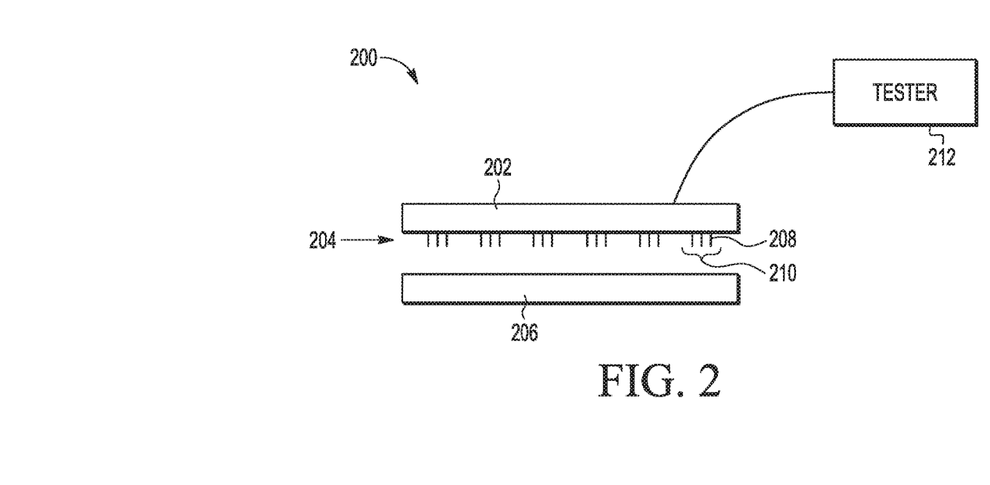
FIG. 2 illustrates a block diagram depicting an example wafer level testing environment in which the disclosure is implemented, according to some embodiments.

FIG. 2 illustrates a block diagram depicting an example test environment 200 for wafer level testing 102. A wafer 206 is a semiconductor wafer that includes a plurality of semiconductor die. Each die of wafer 206 includes active circuitry that includes integrated circuit components that are active when the die is powered. Each die also includes a number of test pads, which are conductive pads coupled to power supply lines or signal lines of the active circuitry for applying electrical signals and reading results during wafer level testing 102. Examples of the integrated circuit components of active circuitry on a die include but are not limited to one or more processing cores, volatile memory such as high-speed random access memory (RAM), non-volatile memory such as read-only memory (ROM) or flash memory, logic circuitry, analog circuitry, and standalone discrete devices such as resistors, inductors, capacitors, diodes, power transistors, and the like.

Test environment 200 includes a tester 212, which is equipment that is configured to perform wafer level test operations on wafer 206. Tester 212 is connected to a probe card 202 that includes plurality of probe pins 204. The plurality of probe pins 204 are arranged into a number of pin groups 210 that each correspond to a respective die of wafer 206. Each probe pin 208 of a pin group 210 is aligned with a test pad on the respective die. Tester 212 applies various patterns of electrical signals to a set of test pads of the die as part of wafer level testing 102, where the various patterns of electrical signals implement various parametric tests performed to exercise the active circuitry of the die. Tester 212 also reads the results produced by the active circuitry, which may be provided at another set of test pads of the die. The parametric test results are evaluated by tester 212 to determine whether each die-under-test passed the requisite parametric tests, and ultimately whether each die-under-test passed wafer level testing 102.

Figure 3:
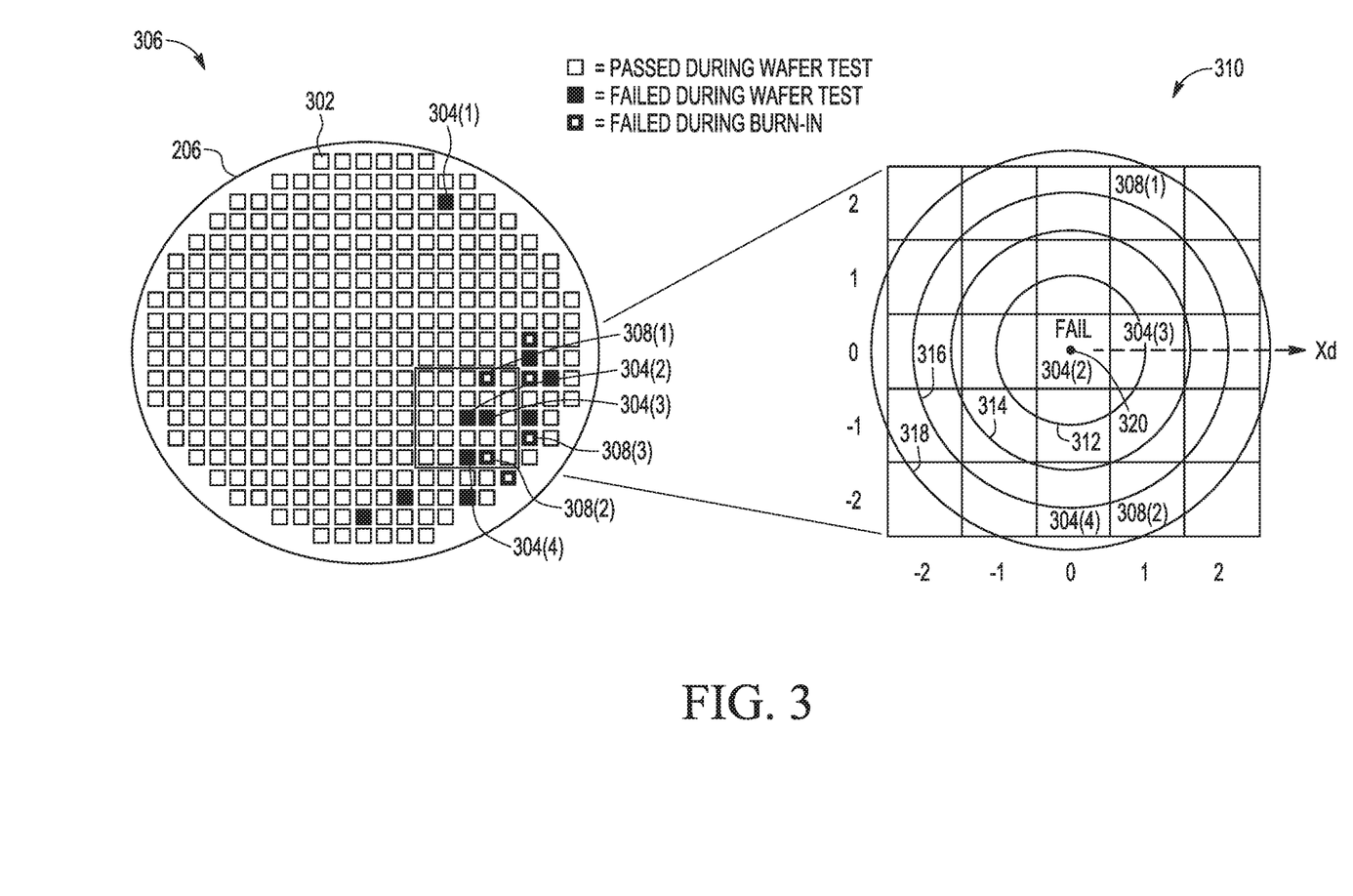
FIG. 3 illustrates a block diagram depicting example fault data resulting from wafer level testing and an example fault impact distribution overlay in which the disclosure is implemented, according to some embodiments.

It is noted that the kernel transform of fault analysis 110 is applied to fault data that indicate binary test results such as pass/fail status, and is not applied to parametric test results that indicate values returned from a die-under-test or values that correspond to how a die-under-test performed during wafer level testing 102 (e.g., a die-under-test may pass some parametric test by having a result that falls within one of a number of target ranges of values, indicating how "well" the die-under-test passed). Fault data that indicates binary test results may include a binary wafer map indicating a pass/fail status for a die (e.g., indicated by a bit value of 0 or 1 or similar binary indication) associated with or placed at the corresponding location of the die, which is illustrated in FIG. 3. It is noted that there are typically many binary pass/fail tests performed during wafer level testing 102. The fault analysis 110 will be applied to only the binary pass/fail tests that are relevant to the fabrication defects or process abnormality to be detected.

FIG. 3 illustrates a block diagram depicting example fault data 306 for wafer 206 resulting from wafer level testing 102 (as shown on the left side of FIG. 3) and an example fault impact distribution 310 overlaying a portion of wafer 206 in an expanded view (as shown on the right side of FIG. 3). Wafer 206 includes a plurality of die 302 arranged in an array of rows and columns. Fault data 306 from wafer level testing 102 is also illustrated on the left side of FIG. 3, where pass status for a die is illustrated as a white or lightly outlined square and fail status for a die is illustrated as a blackened square at the die's corresponding location on wafer 206. For example, a number of failed die 304(1)-(N) from wafer level testing 102 are shown as large blackened squares in their corresponding locations on wafer 206. Fault data from burn-in stress testing 106 is also illustrated on the left side of FIG. 3, where the failed die 308(1)-(N) from burn-in stress testing 106 are shown as heavily outlined squares in their corresponding locations on wafer 206. It is noted that fault analysis 110 operates on fault data 306 from wafer level testing 102, while fault data from burn-in stress testing 106 is utilized for verification of the cluster data generated by fault analysis 110, as discussed above.

The expanded view on the right side of FIG. 3 shows a 5×5 array of neighboring die of failed die 304(2). Die coordinates centered at failed die 304(2) are provided to identify neighboring die by an x-coordinate (indicating a column coordinate) and a y-coordinate (indicating a row coordinate), or (x, y), as viewed from the top-down view of wafer 206. Failed die 304(2) is located at center die coordinates (0,0), and has immediately adjacent neighbors at (−1,0), (−1,1), (0,1), (1,1), (1,0), (1,−1), (0,−1), and (−1,−1). For example, failed die 304(3) is an immediately adjacent neighboring die at (1,0), while failed die 304(4) is a neighboring die at (0,−2) and is not immediately adjacent to failed die 304(2).

Fault impact distribution 310 is shown as having a radial or circular shape and overlays the portion of wafer 206 illustrated in the expanded view on the right side of FIG. 3. A center point 320 of fault impact distribution 310 is aligned or centered over a center point of a target failed die, such as failed die 304(2). A distance Xd is measured from a center point 320 of the target failed die, where the location of the center point 320 of the target failed die is also referred to as Xd=0. Fault impact distribution 310 extends out and away from failed die 304(2) in both row and column directions.

As noted above, fault impact distribution 310 is used to determine a fault contribution value for each neighboring die of the target failed die, as a function of distance from the target failed die. In the embodiment shown, fault impact distribution 310 includes concentric circles 312-318 as delineating arbitrarily placed concentric radial portions to show how the fault contribution value associated with neighboring die decreases as distance Xd from the target failed die increases. For example, fault impact distribution 310 shows a first radial boundary 312 at a first distance Xd[1] away from the target failed die, where boundary 312 delineates a central portion of fault impact distribution 310 that indicates a large fault contribution value should be assigned to any neighboring die that fall within boundary 312. A second radial boundary 314 at a second distance Xd[2] away from the target failed die (and outside of boundary 312) delineates a concentric radial portion around the central portion of fault impact distribution 310, where neighboring die that fall outside of boundary 312 and within boundary 314 should be assigned a next-largest fault contribution value. A third radial boundary 316 at a third distance Xd[3] away from the target failed die (and outside of boundary 316) delineates another concentric radial portion of fault impact distribution 310, where neighboring die that fall outside of boundary 314 and within boundary 316 should be assigned a subsequent next-largest fault contribution value. Finally, a fourth radial boundary 318 at a fourth distance Xd[4] away from the target failed die delineates an outer concentric radial portion of fault impact distribution 310, where neighboring die that fall outside of boundary 316 and within boundary 318 should be assigned a smallest fault contribution value.

It is noted that neighboring die that fall across boundaries may be assigned a fault contribution value based on the portion of the die that falls within a given radial portion of fault impact distribution 310. In some embodiments, boundary 318 indicates an outer boundary at a terminal distance from the target failed die, where the fault contribution value falls to near zero outside of the outer boundary. The outer boundary is adjustable based on a bandwidth component σ of the fault impact distribution, as further discussed below. It is also noted that both passed die and failed die that fall within the outer boundary of fault impact distribution 310 are assigned a respective fault contribution value, where the fault contribution values assigned to any given die depend upon the number and proximity of neighboring failed die.

It is also noted that fault impact distribution 310 need not be discretized into radial portions, but instead is a continuous value function that provides continuous fault contribution values that decrease as distance Xd from the target failed die increases. Examples of continuous fault impact distributions are shown in FIG. 6.

Figure 6:
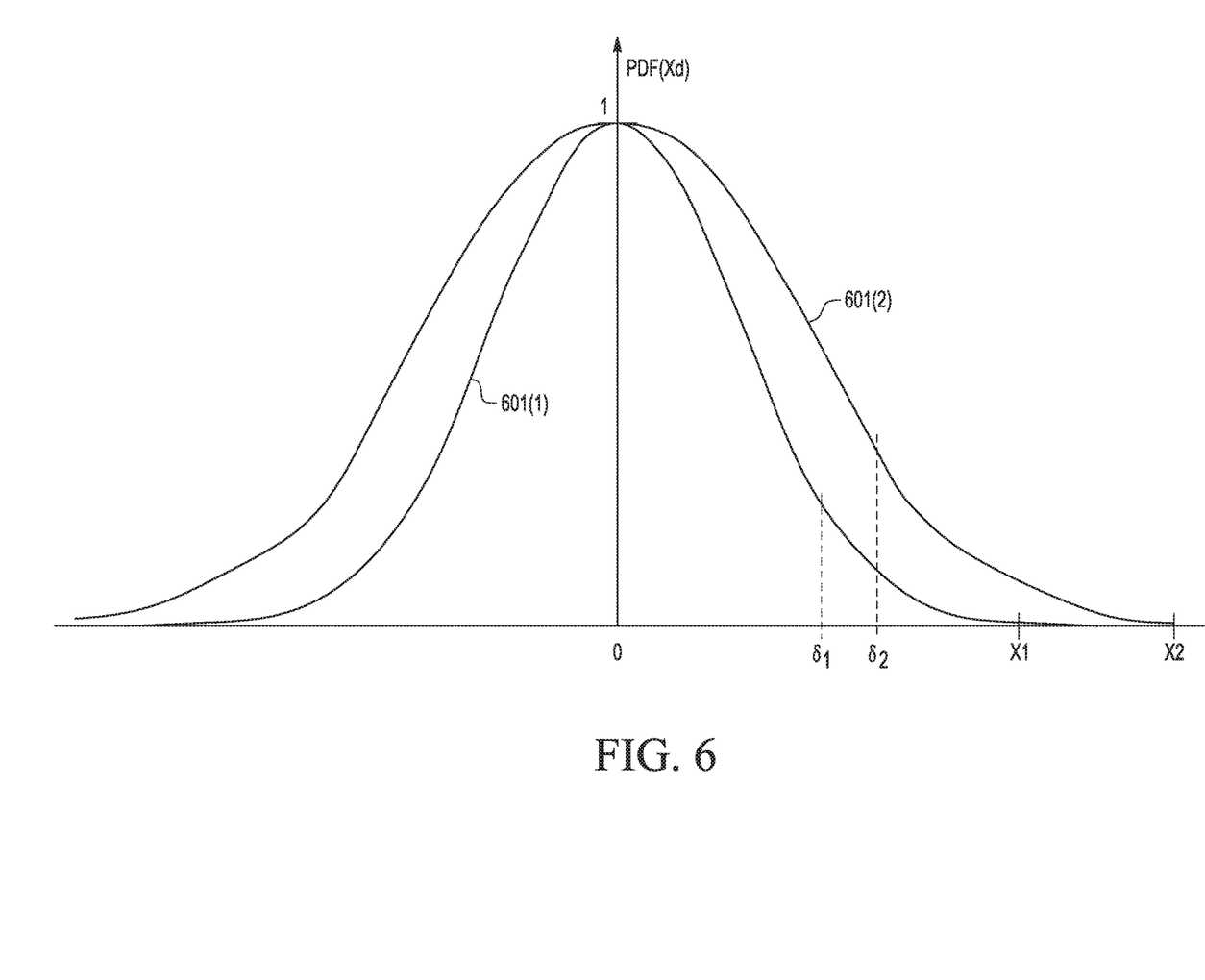
FIG. 6 is a curve graph depicting example fault impact distribution curves in which the disclosure is implemented, according to some embodiments.

FIG. 6 is a curve graph depicting example fault impact distribution curves 601(1) and 601(2), which each illustrate the continuous value contribution of fault from a failed die to its surrounding die as a function of distance Xd from the failed die. The fault impact distribution curves 601(1) and 601(2) are applied to a target failed die of wafer 206 and indicate continuous fault contribution values to be assigned to neighboring die in both the row and column dimensions on the wafer, which results in a continuous radial distribution similar to the fault impact distribution 310 illustrated in FIG. 3.

It is noted that example fault impact distribution curves 601(1) and 601(2) are based on a probability density function of a normal distribution as a function of distance x, referred to as PDF(x), that is defined by the kernel transform implemented in fault analysis 110. PDF(x) is shown below as Equation 1.

$$PDF(x) = \frac{1}{\sigma\sqrt{2\pi}} e^{-\frac{(x-\mu)^2}{2\sigma^2}} \qquad \text{Equation 1}$$

In order for PDF(x) to estimate fault contribution from a location of a failed die to surrounding die, the mean μ of PDF(x) is equal to zero to center PDF(x) around x=0 (e.g., to center the distribution around the location of the failed die) and PDF(x) takes the form as noted in Equation 2.

$$PDF(x) = \frac{1}{\sigma\sqrt{2\pi}} e^{-\frac{x^2}{2\sigma^2}} \qquad \text{Equation 2}$$

In order to simplify the values of fault contribution estimated by PDF(x) of Equation 2, PDF(x) of Equation 2 is normalized to one at x=0, where PDF(x) takes the form as noted in Equation 3, as a function of distance x from the failed die. PDF(x) of Equation 3 is also referred to as the fault impact distribution.

$$PDF(x) = e^{-\frac{x^2}{2\sigma^2}} \qquad \text{Equation 3}$$

Returning to FIG. 6, example fault impact distribution curves 601(1) and 601(2) are based on the fault impact distribution PDF(x) of Equation 3, where the X-axis of the graph illustrates distance Xd from a center point of a failed die located at Xd=0, and the Y-axis of the graph illustrates PDF(Xd), or the fault impact distribution as a function of distance Xd from the failed die. Curves 601(1) and 601(2)

are normalized, as shown as PDF(Xd) having a peak value of one when Xd equals zero. As discussed above, the fault impact distribution is used to assign or associate a fault contribution value to each surrounding die, as a function of distance from the failed die. Since the fault impact distribution is normalized, the failed die is associated with a fault contribution value of 1, while the surrounding die are each associated with a fault contribution value of less than one, where the fault contribution value decreases as distance Xd from the failed die increases. It is noted that the fault impact distribution is a normalized Gaussian distribution. It is also noted that FIG. 6 is not drawn to scale.

The fault impact distribution can be scaled to fit wafers having different numbers of die or to model different types of fabrication defects or systemic process abnormalities by varying the bandwidth σ, which varies the terminal distance of the fault impact distribution where fault contribution value falls to near zero outside of the terminal distance. In other words, varying the bandwidth a results in a corresponding change to the outer radial boundary of the fault impact distribution. A scalable bandwidth is beneficial for performing fault analysis for wafers of differing technology, since some wafers include a much larger number of die. Further, those die may be much smaller die as technology advances, where the fabrication faults may affect a greater number of die that fit within a given unit area, as compared to the number of die of an older technology wafer, and the fault contributed from a failed die may be estimated to impact a larger number of surrounding die. For example, a first wafer having some number of die may utilize curve 601(1) having a first bandwidth (σ1), where curve 601(1) indicates that fault contribution from the failed die reaches a terminal distance of X1 (at which point the fault contribution is estimated to be zero). A second wafer having a greater number of die may utilize curve 601(2) having a second bandwidth (σ2), where the second bandwidth (σ2) is greater than the first bandwidth (σ1), and curve 601(2) indicates that fault contribution from the failed die reaches a further terminal distance of X2 (at which point the fault contribution is estimated to be zero). Empirical data generally indicates that a bandwidth a greater than 2 and less than 5 works well, with specific examples including but not limited to a bandwidth a that falls within a range of 2 to 3, a range of 2 to 4, and a bandwidth a with a value of 2.3, 2.5, 2.75, or 3, or near to such values.

Figure 4:
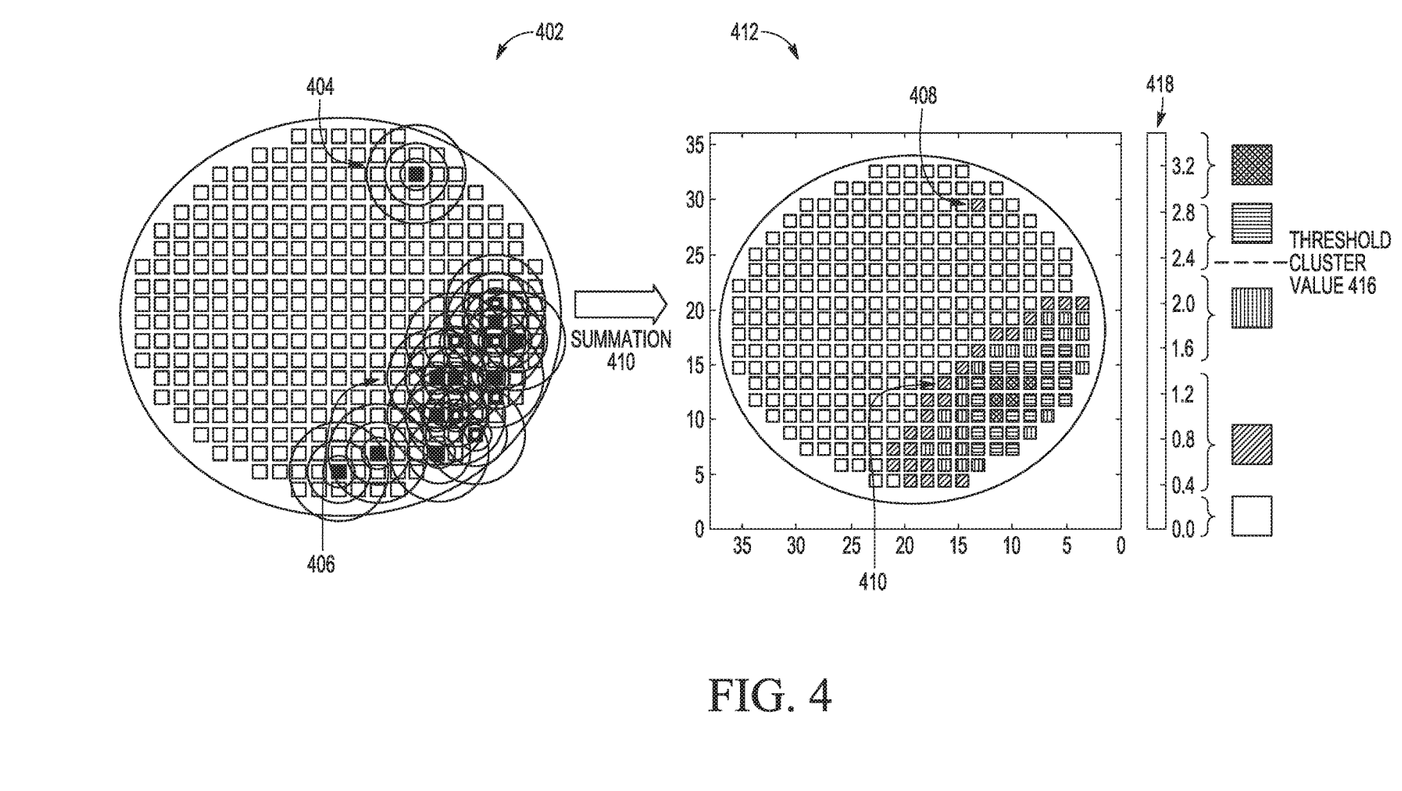
FIG. 4 illustrates a block diagram depicting a kernel transform applied to fault data resulting from wafer level testing to produce example cluster data in which the disclosure is implemented, according to some embodiments.

FIG. 4 illustrates a block diagram depicting the application of kernel transform to fault data 306 (illustrated as transformation 402 on the left side of FIG. 4) to produce example cluster data 412 (illustrated on the right side of FIG. 4). The fault impact distribution 310 is applied to each failed die 304(1)-(N) identified in fault data 306 and fault contribution values are assigned or associated with neighboring die, as indicated by sets of concentric circles surrounding each failed die 304(1)-(N). For example, the fault impact distribution is applied at failed die 304(1) and neighboring die to die 304(1) are assigned fault contribution values as illustrated by a set of concentric circles, referred to as fault contribution overlay 404. The fault impact distribution is also applied at failed die 304(2), 304(3), 304(4), and other failed die identified in fault data 306 and the neighboring die of those failed die receive fault contribution values as illustrated by multiple sets of overlapping concentric circles, referred to as fault contribution overlay 406.

As the kernel transform applies the fault impact distribution to each failed die identified in fault data 306, fault contribution values associated with each individual die are accumulated or summed to result in a cluster value associated with each individual die. Alternatively, the fault contribution values associated with each individual die are summed after the kernel transform has applied the fault impact distribution to every failed die identified in fault data 306, in order to produce a cluster value associated with each individual die. The cluster value of an individual die reflects the fault contributed to it from neighboring failed die. A cluster value at a specific location L, or Cval(L), is defined in Equation 4.

$$Cval(L)=\Sigma Fcnt(D_i)*PDF(D_i) \qquad \text{Equation 4}$$

Fcnt(Di) indicates a number of failed die at a distance Di from location L. PDF(Di) is the fault contribution value at location L from each failed die around location L, as a function of distance Di from the specific location L. Cval(L) is the summation of the product of Fcnt(Di) and PDF(Di) at location L from all die on the wafer.

After the fault contribution values are either accumulated or summed (shown as summation 414) to produce the cluster values of cluster data 412, each of the cluster values are compared with a threshold cluster value 416 to determine whether a clustering failure is detected. Respective cluster values resulting from transformation 402 are illustrated in a heat map to simplify discussion, where the magnitude of each cluster value falls in one of several magnitude ranges indicated by heat map legend 418 and each cluster value is illustrated on the heat map using a respective hatch pattern associated with one of the magnitude ranges. A cluster value having a magnitude of zero indicates no failure is detected, as shown by the white squares (or lightly outlined squares). If a cluster value having a non-zero magnitude is less than the threshold cluster value 416, a clustering failure is not identified, indicating that a random non-clustering failure occurred. An example of such a non-clustering failure is shown in area 408, where the cluster value is less than the threshold cluster value 416 and is from the contribution of a single random defective die 304. If the magnitude of the cluster value is equal to or greater than the threshold cluster value 416, a clustering failure is identified, indicating that a systemic fabrication defect or abnormality likely occurred during wafer fabrication 112. An example of such a clustering failure is shown in area 410, where the cluster values of the die in the surrounding area are equal to or greater than the threshold cluster value 416.

Empirical data generally indicates that a threshold cluster value having a magnitude of greater than 2 and less than 4 works well, with specific examples including but not limited to a threshold cluster value having a magnitude that falls within a range of 2 to 3.5, a range of 2.3 to 3.4, and a threshold cluster value having a magnitude at 2.3, 2.4, or 2.5, or near to such values. The magnitude of threshold cluster value 416 can also be adjusted to increase sensitivity (e.g., reducing the magnitude of threshold cluster value 416) or decrease sensitivity (e.g., increasing the magnitude of threshold cluster value 416) for detecting clustering failures. For example, as discussed above, fault data from burn-in stress testing 106 is utilized for verification of the cluster data 412 by comparing locations of failed die 308(1)-(N) identified during burn-in stress testing 106 with the locations of predicted likely-to-fail die identified in cluster data 412 and verifying whether any locations of the burn-in stress failed die match the locations of predicted likely-to-fail die in identified clustering failure area 410. While a high match rate indicates the cluster data 412 is accurately predicting burn-in stress failed die, a low match rate may indicate that the sensitivity of detecting clustering failures should be increased.

Once a clustering failure is detected, die having a cluster value equal to or greater than the threshold cluster value 416 are identified as part of the clustering failure and are predicted likely-to-fail die. Any die included in a clustering failure may be exposed to higher scrutiny by sending those die to burn-in stress testing 106 or may simply be discarded before being assembled into a package.

Figure 5:
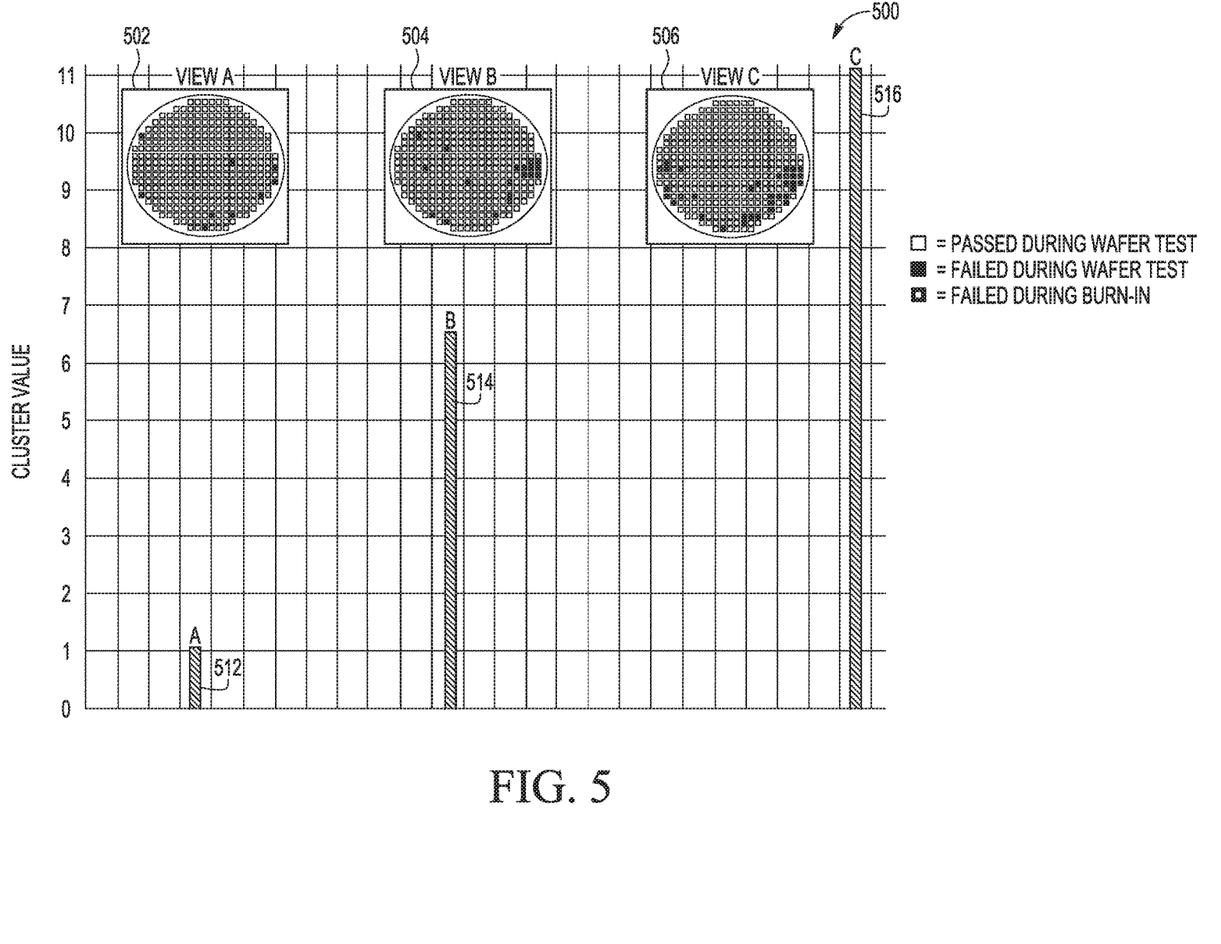
FIG. 5 illustrates a bar chart depicting example maximum cluster values for example wafers having different numbers of failed die in which the disclosure is implemented, according to some embodiments.

FIG. 5 illustrates a bar chart depicting example maximum cluster values for example wafers having different numbers of failed die, where the maximum cluster value of a die can be utilized as a metric for comparing the severity of clustering failures across wafers. For example, fault data 502 of wafer A shows several failed die that are widely spaced from one another. Wafer A has a maximum cluster value 512 having a magnitude near 1, which indicates little to no overlap of fault contribution from failed die. Fault data 504 of wafer B shows several failed die as widely spaced from one another, as well as a group of failed die that are closely spaced to one another. Wafer B has a maximum cluster value 514 having a magnitude greater than 6, which indicates an intermediate amount of overlap of fault contribution from failed die. The wafer map of wafer B shows a cluster of wafer testing failed die (blackened squares) at the right edge of the wafer, and several burn-in stress failed die (heavily outlined squares) near that cluster. Fault data 506 of wafer C shows a greater number of closely spaced failed die. Wafer C has a maximum cluster value 516 having a magnitude greater than 11, which indicates a large amount of overlap of fault contribution from failed die. The wafer map of wafer C shows a small cluster and a large cluster of wafer testing failed die (blackened squares) at the left and the right edge of the wafer, respectively. There are several burn-in stress failed die near each cluster. Those examples demonstrate the effectiveness of the kernel based cluster algorithm to identify cluster fault that may lead to burn-in stress failures.

Figure 7:
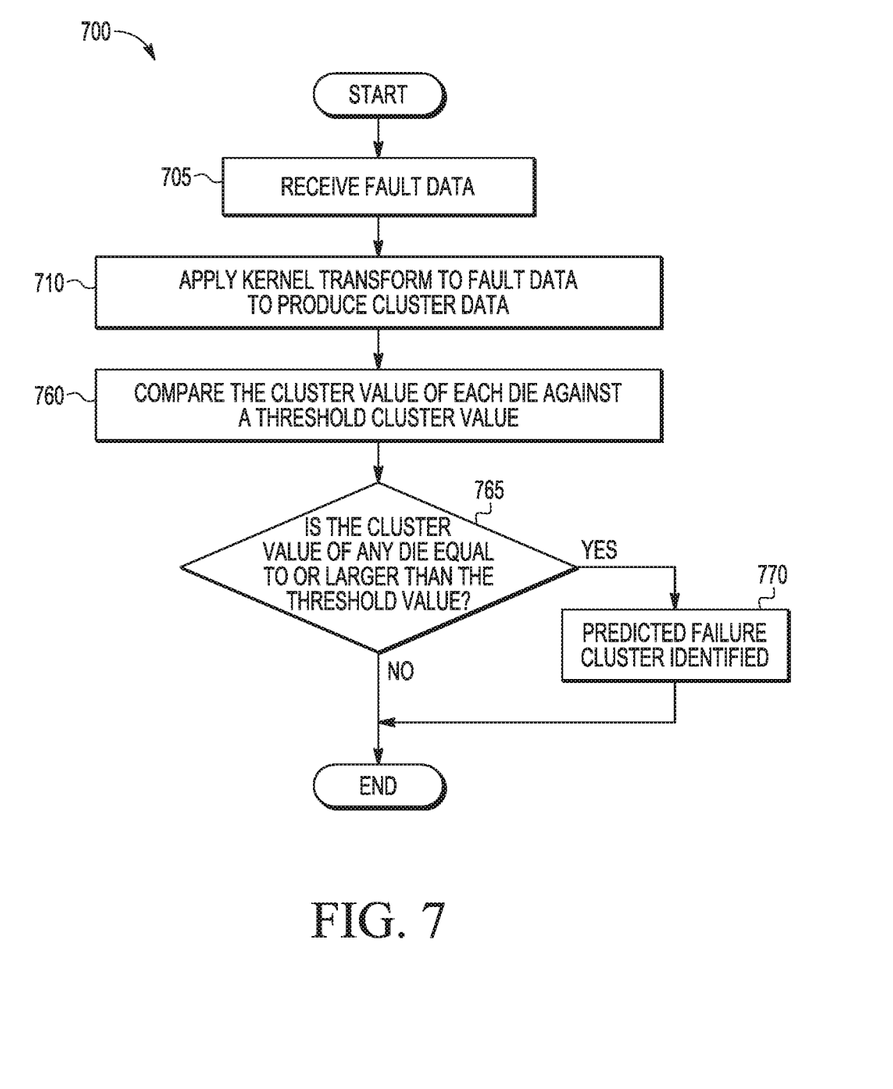
FIGS. 7 and 8 are flowcharts depicting an example fault analysis process in which the disclosure is implemented, according to some embodiments.

FIG. 7 is a flowchart depicting an example fault analysis process 700 implemented by a fault analysis logic module during fault analysis. Fault analysis logic module is further discussed below in connection with FIG. 9.

Figure 8:
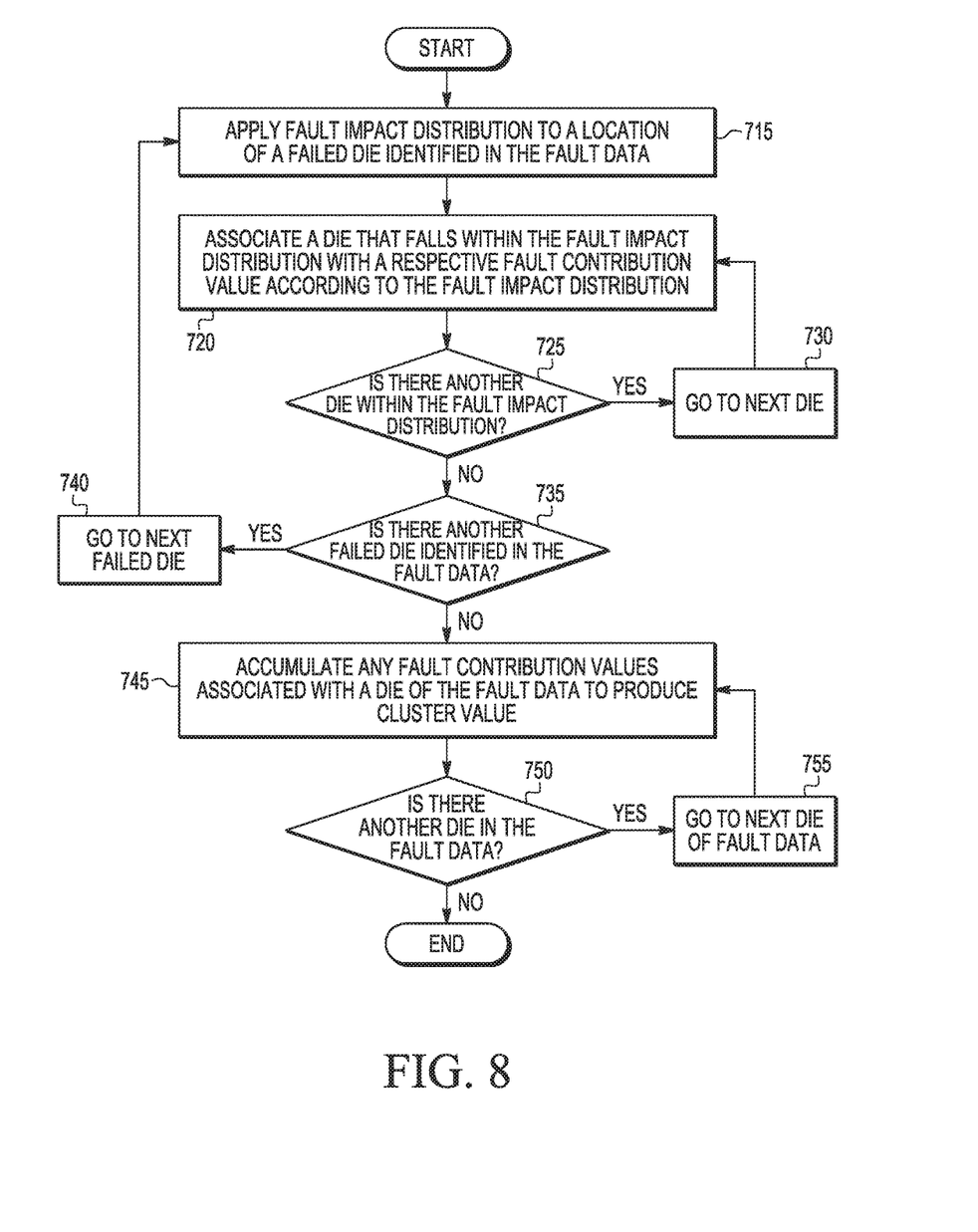

The process 700 begins at operation 705, where fault analysis logic module receives fault data from wafer level testing, as discussed above. The process continues to operation 710, where fault analysis logic module applies the kernel transform to the fault data to produce a cluster value for every die on a wafer (also cumulatively referred to as cluster data), as discussed above. Operation 710 implements a number of further operations, as shown in FIG. 8. The process continues to operation 760, where fault analysis logic module compares the cluster value of each die against a threshold cluster value. The process continues to operation 765, where fault analysis logic module determines whether the cluster value of any die is equal to or larger than the threshold value. If a given cluster value is equal to or larger than the threshold value, the process continues to operation 770, where fault analysis logic module has identified a predicted failure cluster. The die associated with the given cluster value is identified as part of the predicted failure cluster. The process then ends. Returning to operation 765, if none of the cluster values are equal to or larger than the threshold value, the process then ends with no predicted failure cluster.

FIG. 8 is a flowchart depicting further operations of operation 710, beginning at operation 715. In operation 715, fault analysis equipment applies a fault impact distribution of the kernel transform to a location of a failed die identified in the fault data, as discussed above. The process continues to operation 720, where fault analysis equipment associates a die that falls within the fault impact distribution with a respective fault contribution value, according to the fault impact distribution, as discussed above. The process continues to operation 725, where fault analysis determines whether another die is within the fault impact distribution, as discussed above. If there is another die, the process continues to operation 730 to go to that die, and the process returns to operation 720. In other words, operation 720 is reiterated for each die that falls within the fault impact distribution.

Returning to operation 725, if there are no remaining die that fall within the fault impact distribution (e.g., all die that fall within the fault impact distribution have received a respective fault contribution value), the process continues to operation 735. In operation 735, fault analysis equipment determines whether another failed die is identified in the fault data. If there is another failed die, the process continues to operation 740 to go to that failed die, and the process returns to operation 715. In other words, operations 715 and 720 are reiterated for each failed die identified in the fault data.

Returning to operation 735, if there are no remaining failed die identified in the fault data (e.g., all failed die have had the fault impact distribution applied to them), the process continues to operation 745. In operation 745, fault analysis equipment accumulates any fault contribution values associated with a given die (passed die or failed die) of the fault data to produce a cluster value for the die. The process continues to operation 750, where fault analysis equipment determines whether there is another die (passed die or failed die) in the fault data. If there is another die, the process continues to operation 755 to go to that next die, and the process returns to operation 745. In other words, operation 745 is reiterated for each die of the fault data (e.g., each die on the wafer). Returning to operation 750, if there are no remaining die that have fault contribution values that need to be accumulated into its cluster value, the process then ends. It is noted that while operation 745 is shown as being performed sequentially after operations 715-740, operation 745 may also be performed simultaneously during operations 715-740, accumulating the fault contribution values for each die as the fault contribution values are associated with each die.

Figure 9:
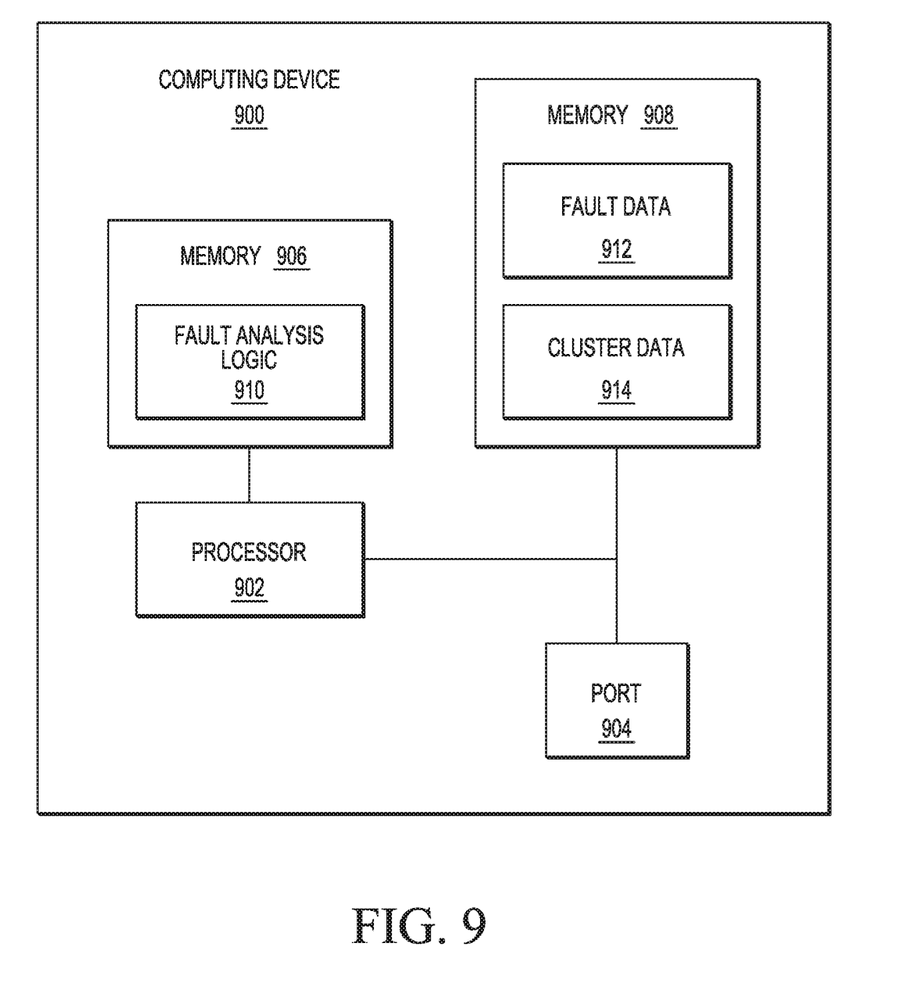
FIG. 9 illustrates a block diagram depicting an example computing device in which the disclosure may be implemented, according to some embodiments.

FIG. 9 illustrates a block diagram depicting relevant components of an example computing device 900, illustrating how a fault analysis logic module 910 implementing a fault analysis process like that shown in FIGS. 7 and 8 can be implemented in software. A computing device 900 includes at least one processing unit, associated memory, and a number of input/output (I/O) devices. Computing device 900 processes information according to a program and produces resultant output information via I/O devices. A program is a list of instructions such as a particular application program and/or an operating system. A computer program is typically stored internally on computer readable storage medium or transmitted to the computing device 900 via a computer readable transmission medium. A computer process typically includes an executing (running) program or portion of a program, current program values and state information (also simply referred to as data), and the resources used by the operating system to manage the execution of the process. Examples of computing device 900 include a mainframe, a server, a workstation, a personal computer, a minicomputer, and the like.

As illustrated, computing device 900 includes one or more processors 902 (e.g., microprocessors, PLDs (Programmable Logic Devices), or ASICs (Application Specific Integrated Circuits)) configured to execute program instructions stored in memories 906 and/or 908. Memories 906 and 908 can include various types of RAM (Random Access Memory), ROM (Read Only Memory), non-volatile memory like FLASH memory, volatile memory, and the like. Computing device 900 also includes one or more ports 904 (e.g., one or more hardware ports or other network interfaces that can be linked to other network devices, hosts, servers, storage devices, or the like). Processor 902, port 904, and memories 906 and 908 are coupled to send and receive data and control signals by one or more buses or other interconnects.

In this example, program instructions executable to implement fault analysis logic module 910 are stored in memory 906. Fault analysis logic module 910 includes the functionality needed to perform the process illustrated in FIGS. 7 and 8. Fault data 912 received from wafer level testing 102 can be stored in memory 908, along with cluster data 914 generated by fault analysis logic module 910. These data can be stored in memory 908 prior to being sent on a network via port 904 and/or in response to being received from a network via port 904. For example, computing device 900 may be coupled to receive fault data 912 from equipment of wafer level testing environment by a wired or wireless network connection via port 904, or may be coupled to send cluster data 914 to equipment in the assembly environment or burn-in stress testing environment coupled to computing device 900 by a wired or wireless network connection via port 904. Computing device 900 may be implemented in the wafer level testing environment, in the assembly environment, or in the burn-in stress testing environment, or may be a standalone device.

The program instructions and/or data executable to implement fault analysis logic module 910 can be stored on various computer readable storage media such as a memory (e.g., RAM (Random Access Memory)) or other media on other computer systems. Such computer readable media may be permanently, removably or remotely coupled to an information processing system such as computing device 900. The computer readable media may include, for example and without limitation, any number of the following: magnetic storage media including disk and tape storage media; optical storage media such as compact disk media (e.g., CD ROM, CD R, etc.) and digital versatile disk (DVD) storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few. In some embodiments, in order be executed, the instructions and/or data are loaded into memory 906 and/or 908 from another computer readable storage medium. The instructions and/or data can also be transferred to a computing device for storage in memory via a network such as the Internet or upon a carrier medium. In some embodiments, the instructions and/or data are conveyed using a carrier medium such as a network and/or a wireless link upon which signals such as electrical, electromagnetic, or digital signals.

By now it should be appreciated that there has been provided a fault analysis methodology that implements a kernel transform defining a fault impact distribution that indicates how fault is contributed from a failed die to neighboring die in the vicinity of the failed die without requiring the neighboring die to be immediately adjacent to the failed die. The kernel transform is applied to binary fault data from wafer level testing to produce cluster data that is used to identify predicted likely-to-fail die that passed wafer level testing but still have a high probability of failing burn-in stress testing.

In one embodiment of the present disclosure, a method for performing fault analysis is provided, which includes receiving fault data from wafer level testing, wherein the fault data identifies locations of a plurality of die on a wafer, and the fault data identifies test results of the plurality of die from the wafer level testing; applying a kernel transform to the fault data to produce cluster data, wherein the kernel transform defines a fault impact distribution for a failed die, the fault impact distribution extends radially out from the failed die and has an outer radial boundary at a terminating distance from the failed die, the fault impact distribution defines fault contribution from the failed die to local die that fall within the outer radial boundary, and the applying the kernel transform comprises: for each die that failed wafer level testing, centering the fault impact distribution at a location of the die that failed wafer level testing, associating each local die that falls within the outer radial boundary with a respective fault contribution value according to the fault impact distribution, and for each respective die of the plurality of die, accruing fault contribution values associated with the respective die to produce a cluster value for the respective die, wherein the cluster value correlates to a probability of failure of the respective die at a future time.

One aspect of the above embodiment provides that the fault data comprises a binary wafer map indicating either a pass status or a fail status for each of the plurality of die.

Another aspect of the above embodiment provides that the fault impact distribution comprises a Gaussian distribution.

A further aspect of the above embodiment provides that the Gaussian distribution is scalable to different pluralities of die by changing a bandwidth value of the Gaussian distribution.

Another aspect of the above embodiment provides that the fault impact distribution is normalized, the failed die is associated with a fault contribution value of 1, according to the normalized fault impact distribution, and remaining local die that fall within the outer radial boundary are associated with respective contribution values of less than 1, according to the normalized fault impact distribution.

Another aspect of the above embodiment provides that the method further includes: comparing each cluster value of the plurality of die to a threshold cluster value; and identifying a failure cluster of predicted likely-to-fail die where at least one cluster value is greater than or equal to the threshold cluster value.

A further aspect of the above embodiment provides that a magnitude of the at least one cluster value greater than or equal to the threshold cluster value correlates to a size and a density of the failure cluster.

Another further aspect of the above embodiment provides that a cluster value having a magnitude of zero indicates no failure, a cluster value having a magnitude less than the threshold cluster value and greater than zero indicates a random non-clustering failure, and a cluster value having a magnitude greater than or equal to the threshold cluster value indicates a systemic clustering failure.

Another aspect of the above embodiment provides that the method further includes: identifying a maximum cluster value from among a plurality of cluster values for the plurality of die, wherein the maximum cluster value correlates to a largest or most dense failure cluster on the wafer, and the maximum cluster value is used as a metric to compare failures across a plurality of wafers.

Another aspect of the above embodiment provides that the fault impact distribution has a first concentric radial portion around the first failed die and a second concentric radial portion around the first concentric radial portion, a first set of the plurality of die that fall within the first concentric radial portion are each associated with a first fault contribution value, a second set of the plurality of die that fall within the second concentric radial portion are each associated with a second fault contribution value, and the second fault contribution value is less than the first fault contribution value.

A further aspect of the above embodiment provides that the first concentric radial portion has a boundary at a first radial distance from the failed die, the second concentric radial portion has a boundary at a second radial distance from the failed die, and the second radial distance is greater than the first radial distance.

In another embodiment of the present disclosure, a method for performing fault analysis is provided, the method includes: receiving fault data from wafer level testing, wherein the fault data identifies locations of a plurality of die on a wafer, and the fault data identifies a subset of failed die of the plurality of die; applying a fault impact distribution to a location of a first failed die, wherein the fault impact distribution extends radially out from the first failed die and defines a first outer radial boundary at a terminating distance from the first failed die; associating a first local die that falls within the first outer radial boundary with a first fault contribution value according to the fault impact distribution; applying the fault impact distribution to a location of a second failed die, wherein the fault impact distribution extends radially out from the second failed die and defines a second outer radial boundary at a terminating distance from the second failed die; associating the first local die that also falls within the second outer radial boundary with a second fault contribution value according to the fault impact distribution; and summing the first fault contribution value and the second fault contribution value to produce a cluster value for the first local die, wherein the cluster value correlates to a probability of failure of the first local die at a future time.

One aspect of the above embodiment provides that the first local die is not immediately adjacent to the first failed die, and the first local die is not immediately adjacent to the second failed die.

Another aspect of the above embodiment provides that the fault impact distribution defines fault contribution values that decrease from a center of the fault impact distribution toward the outer radial boundary.

Another aspect of the above embodiment provides that the method further includes: comparing the cluster value of the first local die to a threshold cluster value; and identifying that the first local die is part of a failure cluster in response to the cluster value being greater than or equal to the threshold cluster value.

Another aspect of the above embodiment provides that the method, further includes: growing the failure cluster by increasing a bandwidth value of the fault impact distribution to produce an extended outer radial boundary of the fault impact distribution that correlates with the bandwidth value, wherein the fault impact distribution defines fault contribution from the failed die to local die that fall within the extended outer radial boundary.

In another embodiment of the present disclosure, a method for performing fault analysis is provided, the method includes: receiving fault data comprising a binary wafer pattern of wafer level testing results for a plurality of die; and applying a kernel transform to the fault data to produce a continuous value wafer pattern, wherein the kernel transform defines a fault impact distribution that is applied to each failed die of the fault data, the fault impact distribution defines fault contribution of each failed die to a local set of die comprising one or more die that fall within an outer radial boundary of the fault impact distribution, each respective die of the fault data accumulates a cluster value indicating an amount of fault contributed to the respective die from surrounding failed die, the cluster value correlates to a probability of failure of the respective die at a future time.

One aspect of the above embodiment provides that the outer radial boundary is defined by a terminating distance from a center failed die, and the fault impact distribution is scalable by adjusting a bandwidth value to produce a corresponding change in the terminating distance that defines the outer radial boundary.

Another aspect of the above embodiment provides that the method further includes: comparing each cluster value of the continuous value wafer pattern to a threshold cluster value; and identifying a failure cluster where at least one cluster value is greater than or equal to the threshold cluster value.

A further aspect of the above embodiment provides that the method further includes one of: discarding predicted likely-to fail die in the failure cluster, or performing burn-in stress testing on the predicted likely-to-fail die in the failure cluster while skipping burn-in stress testing on remaining ones of the plurality of die.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the fault impact distribution implemented by the kernel transform may be adjusted as needed for wafers implementing different numbers of die. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for performing fault analysis, the method comprising:
   receiving fault data from wafer level testing, wherein
      the fault data identifies locations of a plurality of die on a wafer, and
      the fault data identifies test results of the plurality of die from the wafer level testing;
   applying a kernel transform to the fault data to produce cluster data, wherein
      the kernel transform defines a fault impact distribution for a failed die,
      the fault impact distribution extends radially out from the failed die and has an outer radial boundary at a terminating distance from the failed die,
      the fault impact distribution defines fault contribution from the failed die to local die that fall within the outer radial boundary, and
      the applying the kernel transform comprises:
         for each die that failed wafer level testing, centering the fault impact distribution at a location of the die that failed wafer level testing,
         associating each local die that falls within the outer radial boundary with a respective fault contribution value according to the fault impact distribution, and
         for each respective die of the plurality of die, accruing fault contribution values associated with the respective die to produce a cluster value for the respective die, wherein
            the cluster value correlates to a probability of failure of the respective die at a future time.

2. The method of claim 1, wherein the fault data comprises a binary wafer map indicating either a pass status or a fail status for each of the plurality of die.

3. The method of claim 1, wherein the fault impact distribution comprises a Gaussian distribution.

4. The method of claim 3, wherein the Gaussian distribution is scalable to different pluralities of die by changing a bandwidth value of the Gaussian distribution.

5. The method of claim 1, wherein
   the fault impact distribution is normalized,
   the failed die is associated with a fault contribution value of 1, according to the normalized fault impact distribution, and
   remaining local die that fall within the outer radial boundary are associated with respective contribution values of less than 1, according to the normalized fault impact distribution.

6. The method of claim 1, further comprising:
   comparing each cluster value of the plurality of die to a threshold cluster value; and
   identifying a failure cluster of predicted likely-to-fail die where at least one cluster value is greater than or equal to the threshold cluster value.

7. The method of claim 6, wherein a magnitude of the at least one cluster value greater than or equal to the threshold cluster value correlates to a size and a density of the failure cluster.

8. The method of claim 6, wherein
   a cluster value having a magnitude of zero indicates no failure,
   a cluster value having a magnitude less than the threshold cluster value and greater than zero indicates a random non-clustering failure, and
   a cluster value having a magnitude greater than or equal to the threshold cluster value indicates a systemic clustering failure.

9. The method of claim 1, further comprising:
   identifying a maximum cluster value from among a plurality of cluster values for the plurality of die, wherein the maximum cluster value correlates to a largest or most dense failure cluster on the wafer, and the maximum cluster value is used as a metric to compare failures across a plurality of wafers.

10. The method of claim 1, wherein
    the fault impact distribution has a first concentric radial portion around the first failed die and a second concentric radial portion around the first concentric radial portion,
    a first set of the plurality of die that fall within the first concentric radial portion are each associated with a first fault contribution value,
    a second set of the plurality of die that fall within the second concentric radial portion are each associated with a second fault contribution value, and
    the second fault contribution value is less than the first fault contribution value.

11. The method of claim 10, wherein
    the first concentric radial portion has a boundary at a first radial distance from the failed die,
    the second concentric radial portion has a boundary at a second radial distance from the failed die, and
    the second radial distance is greater than the first radial distance.

12. A method for performing fault analysis, the method comprising:
    receiving fault data from wafer level testing, wherein
       the fault data identifies locations of a plurality of die on a wafer, and
       the fault data identifies a subset of failed die of the plurality of die;
    applying a fault impact distribution to a location of a first failed die, wherein
       the fault impact distribution extends radially out from the first failed die and defines a first outer radial boundary at a terminating distance from the first failed die;
    associating a first local die that falls within the first outer radial boundary with a first fault contribution value according to the fault impact distribution;
    applying the fault impact distribution to a location of a second failed die, wherein
       the fault impact distribution extends radially out from the second failed die and defines a second outer radial boundary at a terminating distance from the second failed die;
    associating the first local die that also falls within the second outer radial boundary with a second fault contribution value according to the fault impact distribution; and
    summing the first fault contribution value and the second fault contribution value to produce a cluster value for the first local die, wherein
       the cluster value correlates to a probability of failure of the first local die at a future time.

13. The method of claim 12, wherein
    the first local die is not immediately adjacent to the first failed die, and the first local die is not immediately adjacent to the second failed die.

14. The method of claim 12, wherein the fault impact distribution defines fault contribution values that decrease from a center of the fault impact distribution toward the outer radial boundary.

15. The method of claim 12, further comprising:
comparing the cluster value of the first local die to a threshold cluster value; and
identifying that the first local die is part of a failure cluster in response to the cluster value being greater than or equal to the threshold cluster value.

16. The method of claim 12, further comprising:
growing the failure cluster by increasing a bandwidth value of the fault impact distribution to produce an extended outer radial boundary of the fault impact distribution that correlates with the bandwidth value, wherein
the fault impact distribution defines fault contribution from the failed die to local die that fall within the extended outer radial boundary.

17. A method for performing fault analysis, the method comprising:
receiving fault data comprising a binary wafer pattern of wafer level testing results for a plurality of die; and
applying a kernel transform to the fault data to produce a continuous value wafer pattern, wherein
the kernel transform defines a fault impact distribution that is applied to each failed die of the fault data,
the fault impact distribution defines fault contribution of each failed die to a local set of die comprising one or more die that fall within an outer radial boundary of the fault impact distribution,
each respective die of the fault data accumulates a cluster value indicating an amount of fault contributed to the respective die from surrounding failed die,
the cluster value correlates to a probability of failure of the respective die at a future time.

18. The method of claim 17, wherein
the outer radial boundary is defined by a terminating distance from a center failed die, and
the fault impact distribution is scalable by adjusting a bandwidth value to produce a corresponding change in the terminating distance that defines the outer radial boundary.

19. The method of claim 17, further comprising:
comparing each cluster value of the continuous value wafer pattern to a threshold cluster value; and
identifying a failure cluster where at least one cluster value is greater than or equal to the threshold cluster value.

20. The method of claim 19, further comprising one of:
discarding predicted likely-to-fail die in the failure cluster, or
performing burn-in stress testing on the predicted likely-to-fail die in the failure cluster while skipping burn-in stress testing on remaining ones of the plurality of die.

* * * * *